United States Patent [19]

Murphy et al.

[11] Patent Number: 5,504,653
[45] Date of Patent: Apr. 2, 1996

[54] HEAT SINKING ASSEMBLY FOR ELECTRICAL COMPONENTS

[75] Inventors: William S. Murphy; David A. King, both of Kokomo, Ind.

[73] Assignee: Delco Electronics Corp., Kokomo, Ind.

[21] Appl. No.: 343,070

[22] Filed: Nov. 21, 1994

[51] Int. Cl.$^6$ .................................................. H05K 7/20
[52] U.S. Cl. ........................ 361/704; 257/719; 257/727; 267/160; 361/719
[58] Field of Search .................. 267/150, 164, 267/158–160; 403/261, 267, 372, 373; 174/16.3; 257/706, 707, 712, 713, 718, 719, 723, 724, 727; 361/690, 704, 707, 709, 710, 712, 717–719, 807, 809, 810; 165/80.3, 185; 248/316.2

[56] References Cited

U.S. PATENT DOCUMENTS

| | | | |
|---|---|---|---|
| 3,366,171 | 1/1968 | Scharli | 165/80 |
| 3,911,327 | 10/1975 | Murari et al. | 317/100 |
| 4,167,031 | 9/1979 | Patel | 361/388 |
| 4,190,098 | 2/1980 | Hanlon | 165/1 |
| 4,259,685 | 3/1981 | Romano | 357/81 |
| 4,576,224 | 3/1986 | Eaton et al. | 165/80.2 |
| 4,669,028 | 5/1987 | Faa, Jr. | 361/386 |
| 4,922,601 | 5/1990 | Mikolajczak | 29/450 |
| 4,923,179 | 5/1990 | Mikolajczak | 267/160 |
| 5,016,141 | 5/1991 | Lorig | 361/415 |
| 5,060,112 | 10/1991 | Cocconi | 361/386 |
| 5,109,317 | 4/1992 | Miyamoto et al. | 361/386 |
| 5,132,875 | 7/1992 | Plesinger | 361/704 |
| 5,134,545 | 7/1992 | Smith | 361/388 |
| 5,274,193 | 12/1993 | Bailey et al. | 174/16.3 |
| 5,396,404 | 3/1995 | Murphy | 361/719 |

Primary Examiner—Gerald P. Tolin
Attorney, Agent, or Firm—Mark A. Navarre

[57] ABSTRACT

A heat sinking assembly for dissipating thermal energy from heat generating electrical components wherein the heat sinking assembly includes a component support member and a housing which surrounds and clamps the electrical components to the heat sink wherein the components are not heat sunk until the first half of the housing assembly is attached to the circuit board or to the second half of the housing assembly. The clamping force for the electrical components may also be varied for optimum heat transfer.

15 Claims, 4 Drawing Sheets

HEAT SINKING ASSEMBLY FOR ELECTRICAL COMPONENTS

BACKGROUND OF THE INVENTION

1. Field of the Invention

The instant invention relates to an apparatus for power IC heat sinking which provides positioning and clamping forces using the housing assembly for direct mounting heat sinking. In accordance with the instant invention, the electrical components are not heat sunk until the first half of the housing assembly is attached to the circuit board or to the second half of the housing assembly.

2. Description of Related Art

Most electrical components generate thermal energy. Some components generate so much heat that the component itself may be damaged or may operate improperly unless excess thermal energy is removed during operation. Mechanical and thermal contact assemblies in the form of heat sinks of various forms are conventionally used to protect electronic devices from excess heat. Typically, mechanical and thermal contact assemblies require additional mounting structures, such as rivets, screws, or other hardware, to attach or contact the electrical component to the heat sink. In an effort to eliminate the additional mounting structures, the prior art teaches the use of spring clips to attach the electronic components to the heat sink(s).

Generally, there are two apparatuses presently used for mounting the heat generating electrical components to a heat sink. The first apparatus mounts the component in a conventional manner to the heat sink (parts stand perpendicular to the circuit board) and the necessary normal forces are provided by a plastic clamp, compressing the component to the heat sink. An example of this apparatus is shown in FIG. 1. However, the apparatus of FIG. 1 requires additional fasteners which increases assembly time. Over time these fasteners may become disengaged thus reducing heat transfer efficiency. The heat sink apparatus of FIG. 1 is often not a portion of the housing. Hence, an indirect thermal path is created as thermal energy is dissipated from the components to the intermediate heat sink, such as an internal heat rail or bracket, and then to the final heat sink, typically the housing assembly.

As shown in FIGS. 1 and 2, conventional heat sink arrangements require clamps 2 and fasteners 4 to attach the electrical component 1 to the heat sink 6. As shown in FIG. 3, this arrangement sandwiches the heat generating component 1 between the clamp 2 and the heat sink 6 to ensure proper thermal contact therewith. This arrangement incurs the drawback of increased assembly time and often results in the loss of proper thermal contact when the fasteners become disengaged.

A second apparatus places the electrical components directly in contact with the housing assembly, referred to as alternate lead form (ALF) mounting, and the necessary clamping forces are generated when the joining housing portions are fastened together. An example of this prior art is shown in FIG. 4.

FIG. 4 illustrates a conventional arrangement whereby the heat generating component 1 is positioned on its back on the circuit board 11, and the housing 13 provides the clamping force to ensure proper thermal contact between the component and the heat sink. However, this second apparatus serves to greatly reduce the usable circuit board area after assembly.

U.S. Pat. No. 4,923,179 issued on May 8, 1990 to C. Mikolajczak also discloses an electrical component assembly with a heat sink for providing the assembly with a resilient biasing member for improving the thermal contact between the heat generating components and the housing. However, the interior wall utilized by Mikolajczak creates a thermal bottleneck, and the resilient biasing member is likely to relax over time, thus allowing the clamping forces on the components to be reduced.

U.S. Pat. No. 4,167,031 issued on Sep. 4, 1979 to P. D. Patel discloses a heat sink assembly being clamped to the housing via a screw or threaded bolt. The use of the metal holder member creates an intermediate thermal path which is not present when the components are in direct contact with the housing, and there is no provision for adjusting the clamping forces exerted on the components.

SUMMARY OF THE INVENTION

The present invention provides a simplified yet efficient arrangement for positioning electrical components, whereby the clamping forces are attained by the housing assembly for a direct mounting heat sink arrangement.

In the present invention, heat sunk parts are placed onto a circuit board during the sticklead process of electronic module assembly. The parts could be placed separately on the circuit board adjacent the heat sink, or a heat sink assembly may be built off-line with the electrical components premounted to a heat sink. The heat generating components are not heat sunk until the housing assembly is attached to the electronic module. As the housing assembly is attached to the electronic module, the clamping forces are generated on the heat sunk parts by the housing assembly to make the necessary interface for required thermal performance. In summary, the present invention will provide the direct thermal path and superior performance of the alternate lead form (ALF) mounting apparatus while minimizing the used circuit board area.

BRIEF DESCRIPTION OF THE DRAWINGS

FIGS. 1 and 2 are perspective views, whereas FIG. 3 is a side view.

FIG. 5 is a side view, whereas FIG. 6 is a perspective view of the electrical components being positioned in the force applicator.

FIG. 7 is a side view, whereas FIG. 8 is a perspective view of the components being positioned in the component receiving body.

FIG. 9 is a side view, whereas FIG. 10 is a perspective view of the components being received into the retainer and biasing spring assembly.

DETAILED DESCRIPTION OF THE INVENTION

The following description of the instant invention is not to be taken in a limiting sense, but is made merely for the purpose of illustrating the general principles of the invention. The description presents the best mode for carrying out the instant invention.

Figure 1:
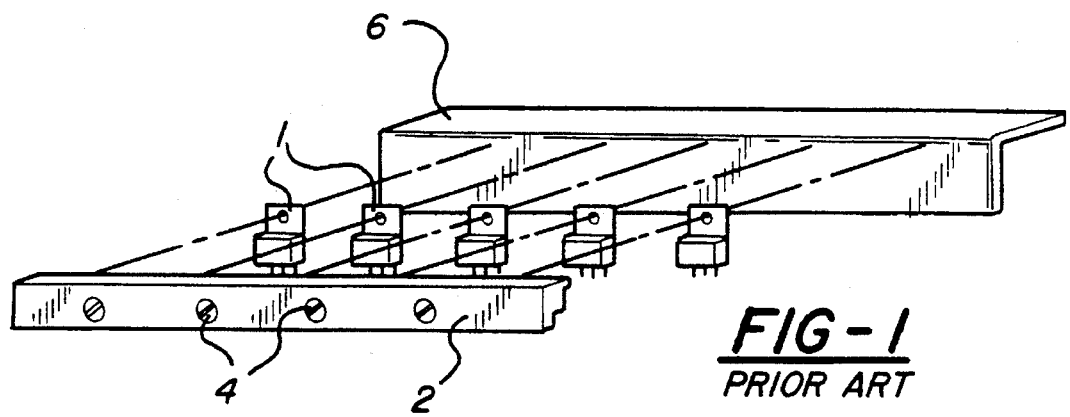
FIGS. 1, 2, and 3 demonstrate the first prior art apparatus of power IC heat sinking.
Figure 2:
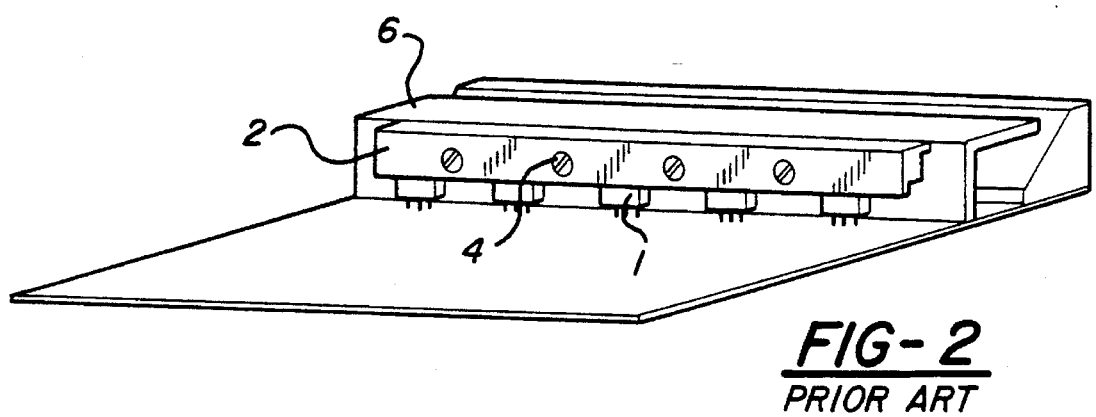
Figure 3:
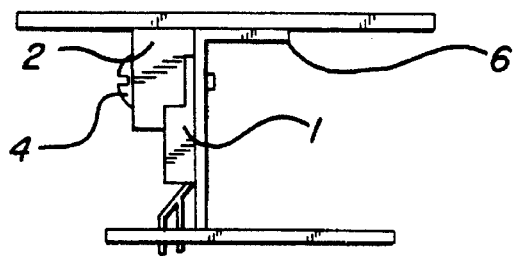
Figure 4:
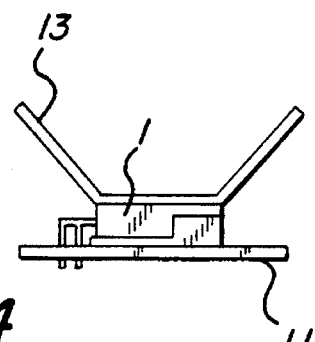
FIG. 4 is the prior art alternate lead form (ALF) mounting apparatus of power IC heat sinking.
Figure 5:
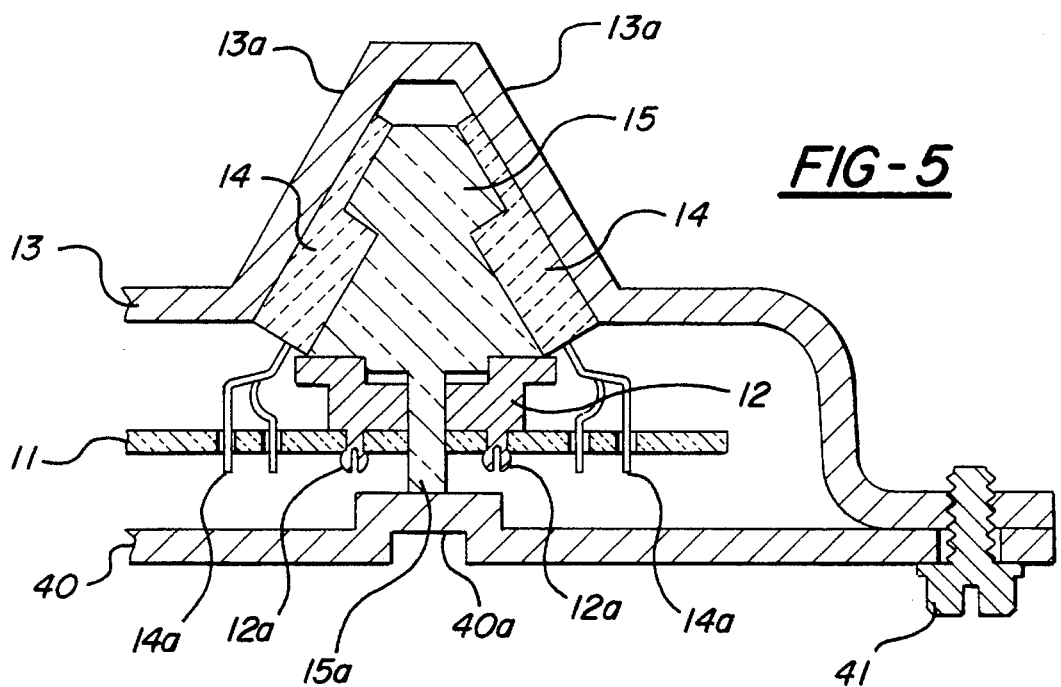
FIGS. 5 and 6 demonstrate the first embodiment of the invention.

With reference to FIG. 5, the heat sink arrangement comprises a printed circuit board 11 with a retainer 12 mounted thereto by means of projections 12A which are received in the circuit board 11. The retainer 12 is formed so as to receive a force applicator 15, wherein the force applicator is provided with stanchions 15A which pass through the retainer 12 and circuit board 11 in the manner illustrated in FIG. 5. The stanchions 15A provide a means by which the contact force between the component 14 and the heat sink assembly may be varied as required for optimum heat transfer for a particular application.

During assembly, the components 14 are position on the force applicator 15, which is then affixed to the circuit board 11. Specifically, the retainer 12, the force applicator 15, and the electrical components are provided with projections 12A, 15A, and leads 14A, respectively, which pass through corresponding apertures provided in the circuit board 11. The retainer is then affixed to the circuit board 11 for instance by snap fit arrangement with the leads 14A of the component 14 being soldered accordingly. The components 14 may consist of any of a number of various known electrical components, i.e. transistor, transformer, inductor and the like. In the first embodiment, the force applicator 15 is provided with recesses 16 (FIG. 6) appropriately formed to receive the components 14 in an upright or angled position relative to the circuit board 11. The applicator 15 also supports the component 14 during the soldering process. The force applicator 15 is made of any suitable material to enhance heat dissipation from the components. This arrangement increases the amount of usable circuit board area while enhancing thermal efficiency. Moreover, the arrangement of the invention simplifies the assembly and soldering process and ensures optimum heat dissipation.

Of course, the order of assembly of the heat sink assembly may be varied depending on the particular application. For instance, the retainer 12 and force applicator 15 may be positioned on the circuit board with the components 14 positioned adjacent these members on the circuit board in the known manner.

In order to provide the necessary clamping force between the component 14 and the force applicator 15, the first housing 13 is provided with housing wall sections 13A which cover the components 14 thereby sandwiching the components 14 between the first housing 13 and the force applicator 15. Thus, there is a direct thermal path between the first housing 13 and the components 14 to further enhance heat dissipation. The stanchion 15A serves to vary the contact force between the first housing 13 and the applicator 15 for optimum heat transfer. The second housing 40 contains a standoff 40A which engages stanchion 15A. A clamping device 41, such as a screw, rivet, or snap-fit means, attaches the first housing 13 to the second housing 40. By varying the clamping force on the clamping device 41 the contact force between the first housing 13 and the applicator 15 is likewise varied.

Figure 6:
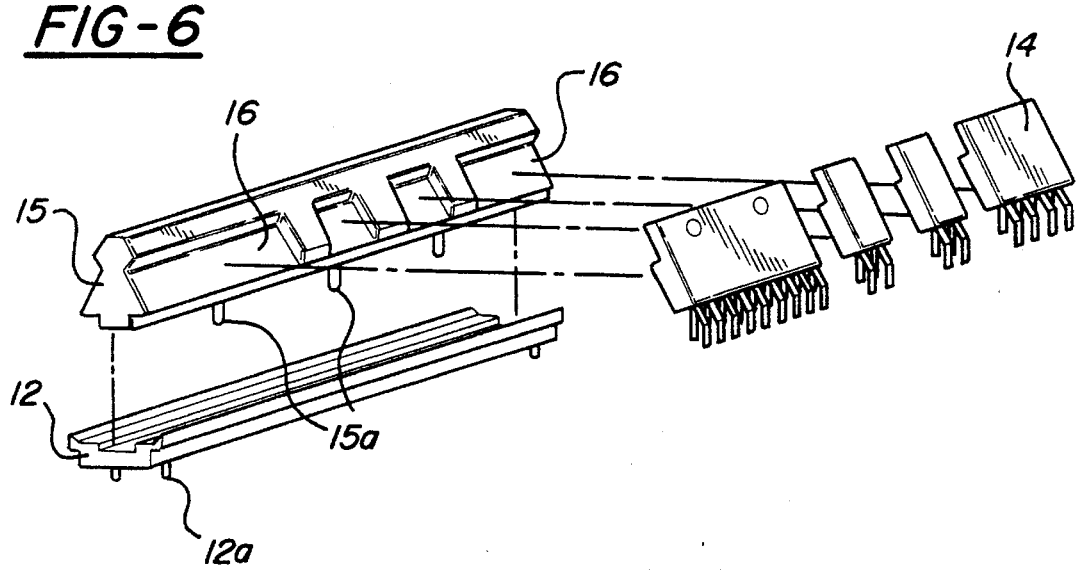

FIG. 6 is a perspective view of the above mentioned embodiment and illustrates the structural relation of the components 14, the applicator 15 and the retainer 12. Although the components 14 are illustrated as being mounted to a single force applicator 15, it should be understood that each component 14 may be provided with an individual applicator 15 and stanchion 15A such that the clamping force for each component 14 may be separately adjusted. Thus, the heat dissipation from each component may be individually controlled or adjusted for a particular application.

Figure 7:
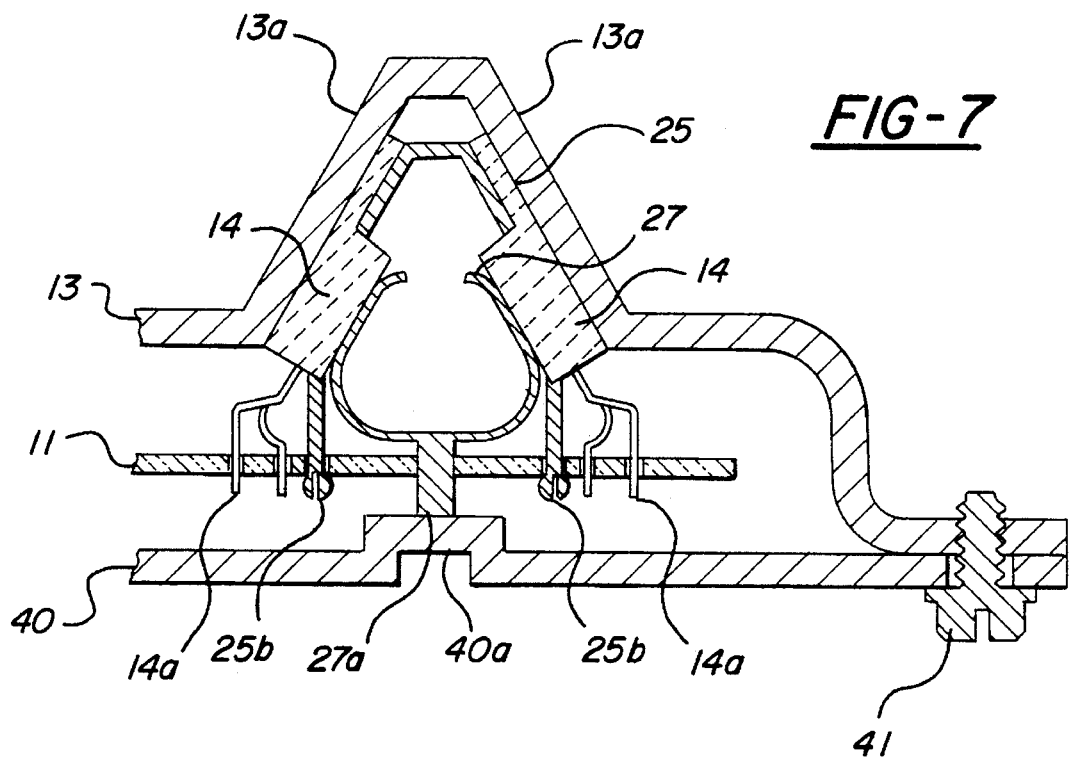
FIGS. 7 and 8 demonstrate the second embodiment of the invention.
Figure 8:
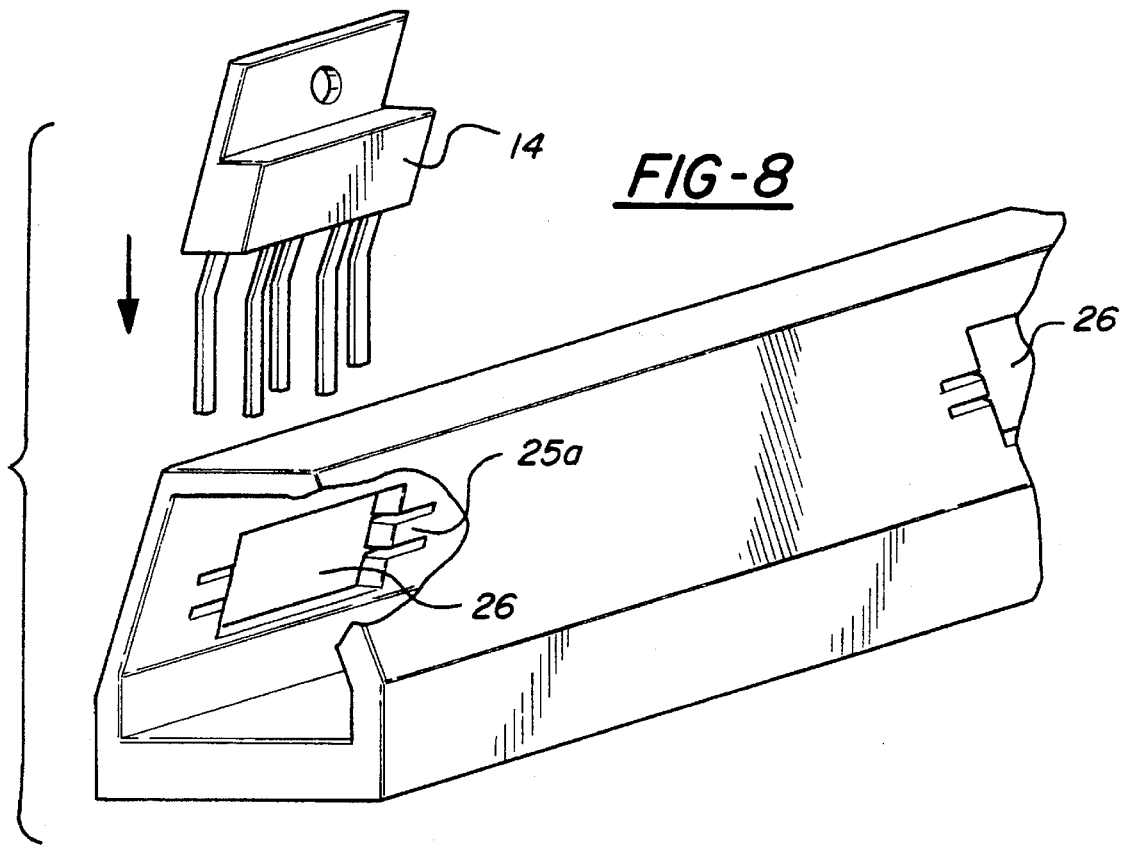

FIGS. 7 and 8 illustrate a second embodiment of the invention whereby the retainer 12 of FIG. 5 is replaced with a component receiving body 25 which is formed to receive the components 14 at various openings 26 provided along its length (FIG. 8). The number and type of openings 26 will depend on the design and application of the electronic module. The component receiving body 25 is affixed to the circuit board 11 for example by the snap-fit projection 25B shown in FIG. 7. Moreover, the components 14 are suitably supported on the circuit board 11 and are provided with leads 14A which pass through the circuit board 11 for soldering by known methods.

Spring fingers 25A are formed in the component receiving body 25 to grip the component 14 in order to provide support during soldering. A force adjusting spring 27 is positioned within the component receiving body 25 and functions to adjust the clamping force applied to the component 14, similar to the force applicator 15 of FIG. 5. As shown in FIG. 7, force adjusting spring 27 comprises a stanchion 27a which serves to vary the contact force between the first housing 13 and the force adjusting spring 27 for optimum heat transfer. The second housing 40 contains a standoff 40A which engages stanchion 27A. A clamping device 41, such as a screw, rivet, or snap-fit means, attaches the first housing 13 to the second housing 40. By varying the clamping force on the clamping device 41 the contact force between the first housing 13 and the force adjusting spring 27 is likewise varied.

As with the first embodiment, each component 14 may be provided with an individual force adjusting spring 27 designed for the desired heat dissipation requirements.

Figure 9:
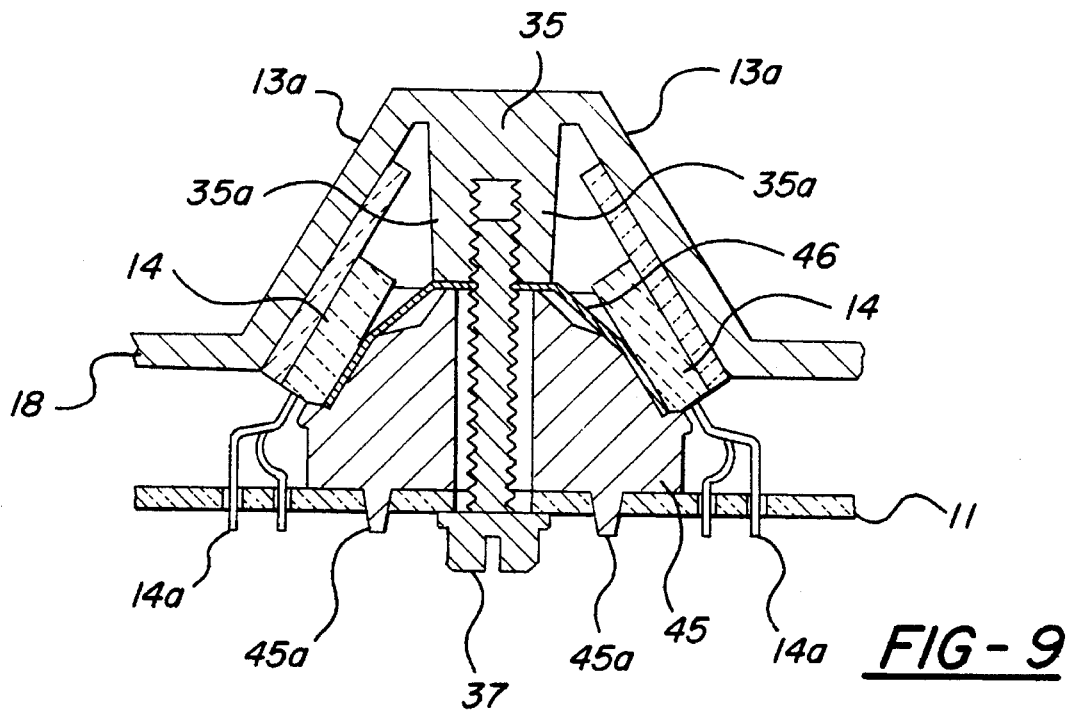
FIGS. 9 and 10 demonstrate the third embodiment of the invention.
Figure 10:
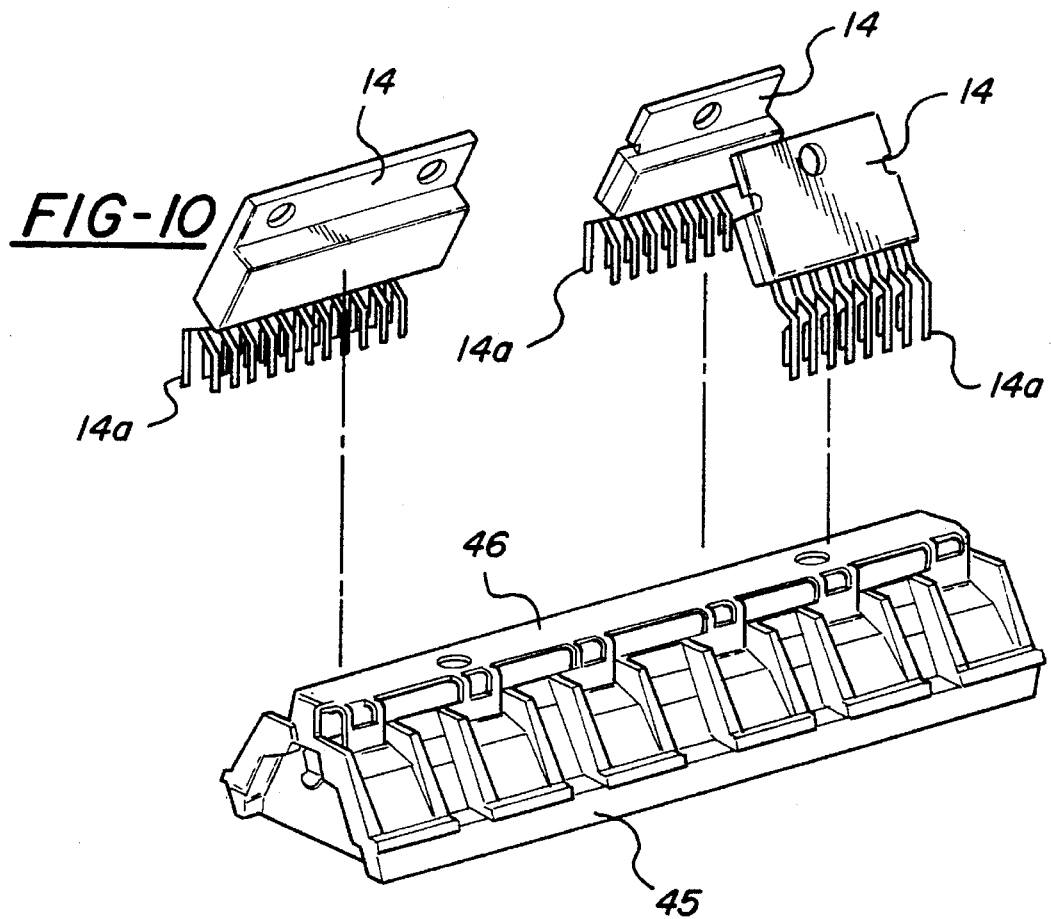

FIGS. 9 and 10 illustrate a third embodiment of the invention whereby the retainer 12 and force applicator 15 of FIG. 5 is modified so as to comprise the retainer 45 and biasing spring 46, respectively, as illustrated in FIG. 9. The retainer 45 functions in the same manner as the retainer 12 of the first embodiment whereby the components 14 are adequately supported during the soldering process. Further, the components 14 are soldered to the circuit board 11 in a known manner via leads 14A and the retainer 45 is affixed to the circuit board 11, for example, by the projections 45A shown in FIGS. 9 and 10.

The housing 13 of FIG. 5 is modified to contain a housing channel 35 as illustrated in FIG. 9. The housing channel 35 is formed with opposed surfaces 35A and engages biasing spring 46 in order to adjust the clamping force applied to components 14. This arrangement creates the clamping force against the housing 13 which enhances the dissipation of thermal energy from the components 14.

In order to adjust the clamping force applied to each component 14, a screw 37 is provided which passes through the circuit board 11 and threadingly engages the housing channel 35. The screw 37 serves to mount the circuit board 11 into the housing 13 and at the same time generates the clamping forces needed for proper thermal dissipation. As the screw 37 is tightened, the housing channel 35 is further drawn into engagement with the biasing spring 46; thus, the clamping force applied to components 14 is increased.

As with the previous embodiments, the clamping forces may be individually adjusted for each component depending on the desired heat dissipation requirements.

From the foregoing description it is understood that the invention provides a heat sink arrangement which provides a direct thermal path from the components 14 to the housing 13, is easy to assemble, and maximizes the usable area of the circuit board 11. The stanchions 15A, 27A and screw 37 permit the adjustment of the clamping force applied to the components 14 to enhance thermal efficiency. The specific type of force adjustment means employed may vary to suit the particular application.

It should be understood by those skilled in the art that the invention is not limited to the particular embodiments shown and described above, but that various changes and modifications may be made without departing from the scope of the present invention.

We claim:

1. A heat sink assembly for heat generating electrical components comprising:

a retainer between first and second parallel rows of said heat generating electrical components;

a force applicator element disposed on said retainer, having first and second opposed surfaces extending parallel with said first and second rows of heat generating electrical components, and a stanchion extending through said retainer;

a first housing having first and second opposed heat dissipative wall sections parallel to said first and second opposed surfaces of said force applicator element, respectively, said first and second housing wall sections having outer surfaces facing away from said heat generating components and inner surfaces which, together with said first and second opposed surfaces of said force applicator element, respectively sandwich said first and second rows of heat generating electrical components; and a second housing having a standoff element engaging said stanchion of said force applicator element in order to control a contact force between said heat generating electrical components and said inner surfaces of said heat dissipative housing wall sections.

2. The heat sink assembly of claim 1, including an adjustable clamping means for attaching said first housing to said second housing, said adjustable clamping means further adjusts said contact force between said heat generating electrical components and the inner surfaces of said heat dissipative housing wall sections.

3. The heat sink assembly of claim 1, wherein said heat generating electrical components have irregular surfaces facing the first and second surfaces of said force applicator element, and the first and second surfaces of said force applicator element complement said irregular surfaces of said heat generating electrical components.

4. The heat sink assembly of claim 3, wherein said surfaces of said heat generating electrical components are notched.

5. The heat sink assembly of claim 1, wherein said first housing and said second housing function as portions of a cover for said assembly.

6. The heat sink assembly of claim 1, wherein said heat generating electrical components and said retainer are mounted on a circuit board, and said stanchion of said force applicator element extends through said retainer and said circuit board.

7. A heat sink assembly for heat generating electrical components comprising:

a retainer between first and second parallel rows of said heat generating electrical components, having first and second opposed walls defining a central cavity, portions of said heat generating electrical components extending into said cavity through openings formed in said first and second opposed walls;

a force adjusting spring disposed in said retainer cavity engaging said portions of said heat generating electrical components which extend into said cavity;

a first housing having first and second opposed heat dissipative wall sections parallel to said first and second retainer walls, respectively, said first housing wall sections having outer surfaces facing away from said heat generating components and inner surfaces which, together with said force adjusting spring, respectively sandwich said first and second rows of said heat generating electrical components.

8. The heat sink assembly of claim 7, including a second housing having a standoff element, said force adjusting spring includes a stanchion, said standoff element of said second housing engaging said stanchion in order to control a contact force between said heat generating electrical components and the inner surfaces of said heat dissipative housing wall sections.

9. The heat sink assembly of claim 8, including an adjustable clamping means for attaching said first housing to said second housing, said adjustable clamping means further adjusts said contact force between said heat generating electrical components and the inner surfaces of said heat dissipative housing wall sections.

10. The heat sink assembly of claim 8, wherein said first housing and said second housing function as portions of a cover for said assembly.

11. The heat sink assembly of claim 8, wherein said heat generating electrical components and said retainer are mounted on a circuit board, and said stanchion of said force adjusting spring extends through said circuit board to engage said standoff element of said second housing.

12. A heat sink assembly for heating generating electrical components comprising:

a retainer between first and second parallel rows of said heat generating electrical components, having first and second opposed surfaces extending parallel with said first and second rows of heat generating electrical components, respectively;

a biasing spring disposed on said retainer, having first and second opposed surfaces extending parallel with said first and second rows of heat generating electrical components, respectively; and a housing having first and second opposed heat dissipative wall sections parallel to said first and second opposed surfaces of said biasing spring, respectively, said housing wall sections having outer surfaces facing away from said heat generating components and inner surfaces which, together with said first and second opposed surfaces of said biasing spring, respectively sandwich said first and second rows of heat generating electrical components, said housing further having a channel engaging said biasing spring for biasing said first and second opposed surfaces of said biasing spring toward said first and second inner surfaces of said housing, respectively.

13. The heat sink assembly of claim 12, including an adjustable fastening means extending through said retainer and said biasing spring for drawing said housing channel into engagement with said biasing spring to adjust the bias of said first and second opposed surfaces of said biasing spring.

14. The heat sink assembly of claim 12, wherein said housing functions as a portion of a cover for said assembly.

15. The heat sink assembly of claim 13, wherein said heat generating electrical components and said retainer are mounted on a circuit board, and said adjustable fastening means extends through said retainer and said circuit board.

* * * * *